(12) United States Patent
Kim et al.

(10) Patent No.: US 8,309,003 B2
(45) Date of Patent: Nov. 13, 2012

(54) IN-PLANE PRINTING RESIN MATERIAL AND METHOD OF MANUFACTURING LIQUID CRYSTAL DISPLAY DEVICE USING THE SAME

(75) Inventors: Jin Wuk Kim, Goyang-si (KR); Yeon Heui Nam, Gangneung-si (KR)

(73) Assignee: LG Display Co., Ltd., Seoul (KR)

( * ) Notice: Subject to any disclaimer, the term of this patent is extended or adjusted under 35 U.S.C. 154(b) by 405 days.

(21) Appl. No.: 12/588,660

(22) Filed: Oct. 22, 2009

(65) Prior Publication Data

US 2010/0112193 A1 May 6, 2010

(30) Foreign Application Priority Data

Oct. 30, 2008 (KR) .................. 10-2008-0107106

(51) Int. Cl.
*B29C 59/00* (2006.01)
*B29C 59/02* (2006.01)
*B29C 35/08* (2006.01)
*B05D 5/06* (2006.01)

(52) U.S. Cl. ........ 264/129; 264/293; 264/320; 264/494; 427/58

(58) Field of Classification Search ............... 427/58; 264/129, 293, 320, 494
See application file for complete search history.

(56) References Cited

U.S. PATENT DOCUMENTS

| 6,482,742 B1 * | 11/2002 | Chou | 438/690 |
| 2009/0008808 A1 * | 1/2009 | Takahashi et al. | 264/1.7 |

FOREIGN PATENT DOCUMENTS

WO WO 2006-092987 * 9/2006

* cited by examiner

*Primary Examiner* — James Lin
(74) *Attorney, Agent, or Firm* — McKenna Long & Aldridge, LLP

(57) ABSTRACT

An IPP resin material capable of improving the adhesive strength between a transparent electrode and an IPP resin layer is disclosed. The IPP resin material includes: a liquid pre-polymer including a mono-functional monomer, a di-functional monomer including a monomer containing an ether group, and a tri-functional monomer including pentaerythritol triacrylate; a photo initiator; and a adhesion promoter, wherein the monomer containing the ether group includes any one of poly(propylene glycol)diacrylate, poly(propylene glycol)dimethacrylate, propylene glycol diacrylate), and tri(ethylene glycol)dimethacrylate.

5 Claims, 7 Drawing Sheets

IN-PLANE PRINTING RESIN MATERIAL AND METHOD OF MANUFACTURING LIQUID CRYSTAL DISPLAY DEVICE USING THE SAME

CROSS-REFERENCE TO RELATED APPLICATION

This application claims priority under 35 U.S.C. 119 to Korean Patent Application No. 10-2008-107106/10-2009-0097051, filed on Oct. 30, 2008 and Oct. 13, 2009, which is hereby incorporated by reference in its entirety.

BACKGROUND

1. Field of the Disclosure

This disclosure relates to an in-plane printing (IPP) resin layer and a liquid crystal display (LCD) device manufacturing method using the same.

2. Description of the Related Art

Recently, thin film transistor and color filter array substrates used in the configuration of LCD devices have adopted an IPP method of pattern formation which, unlike the related art photolithography method.

The IPP method forms a resin layer for the IPP on a substrate and brings a mold with an embossed/intaglio pattern into contact with the resin layer. Then, a repulsive force is generated by creating a surface energy difference between the IPP resin layer and the mold, and a capillary force is generated by the suction of the IPP resin layer into the embossed/intaglio pattern of the mold. Accordingly, the embossed/intaglio pattern of the mold is transcribed onto the IPP resin layer. In other words, an IPP resin layer pattern corresponding to the intaglio pattern of the mold is formed.

The IPP method can simplify the manufacturing process and cut down the manufacturing costs of array substrates. Also, the IPP method can form a high definition pattern and in turn improve the productivity of the pattern and array substrates.

The IPP method mainly uses a resin layer such as a liquid pre-polymer. The resin layer is used for the formation of a pattern, such as a photoresist pattern for a photocopy process. Also, the resin layer is provided as a functional film material such as an overcoat layer, a column spacer, a passivation film, a semi-permeable insulation film, and so on.

The IPP resin layer including an organic insulation film is often covered with a transparent electrode such as indium-tin-oxide (ITO) or indium-zinc-oxide (IZO). However, this results in a poor adhesive strength between the IPP resin layer and the transparent electrode. Therefore, a resin layer which improves the adhesive strength between the IPP resin layer of the organic material and the transparent electrode is necessary.

BRIEF SUMMARY

Accordingly, the present embodiments are directed to an IPP resin layer that substantially obviates one or more of problems due to the limitations and disadvantages of the related art.

An object of the present embodiment is to provide an IPP resin layer capable of improving the adhesive strength between a transparent electrode and an IPP resin layer of an organic material, and an LCD device manufacturing method using the same.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a resin layer for an IPP process includes: a liquid pre-polymer including a mono-functional monomer, a di-functional monomer including a monomer containing an ether group, and a tri-functional monomer including pentaerythritol triacrylate; a photo initiator; and a adhesion promoter, wherein the monomer containing the ether group includes any one of poly (propylene glycol) diacrylate, poly (propylene glycol) dimethacrylate, propylene glycol diacrylate), and tri (ethylene glycol) dimethacrylate.

The mono-functional monomer includes any one of diethylene glycol ethylether acrylate, ethylene glycol methylether acrylate which each contain the ether group.

The mono-functional monomer includes glycidyl methacrylate.

The mono-functional monomer is included in an amount of 5~50 wt %, the di-functional monomer is included in an amount of 10~30 wt %, the tri-functional monomer is included in an amount of 20~40 wt %, the photo initiator is included in an amount of 1~20 wt %, and the adhesion promoter is included in an amount of 1~3 wt %.

The mono-functional monomer is included in an amount of 5~50 wt %, the di-functional monomer is included in an amount of 10~40 wt %, the tri-functional monomer is included in an amount of 10~20 wt %, the photo initiator is included in an amount of 1~20 wt %, and the adhesion promoter is included in an amount of 1~3 wt %.

A manufacturing method of an LCD device according to another aspect of the present embodiment includes: disposing a soft mold above a substrate which includes an in-plane printed resin layer on it; bringing the soft mold into contact with the in-plane printed resin layer to form a thin film pattern; removing the soft mold from the substrate; and forming a transparent electrode on the substrate which includes the thin film pattern. The in-plane printed resin layer includes a liquid pre-polymer including a mono-functional monomer, a di-functional monomer including a monomer containing an ether group, and a tri-functional monomer including pentaerythritol triacrylate; a photo initiator; and a adhesion promoter, wherein the monomer containing the ether group includes any one of poly (propylene glycol) diacrylate, poly (propylene glycol) dimethacrylate, propylene glycol diacrylate), and tri (ethylene glycol) dimethacrylate.

The mono-functional monomer includes any one of diethylene glycol ethylether acrylate, ethylene glycol methylether acrylate which each contain the ether group.

The mono-functional monomer includes glycidyl methacrylate.

The mono-functional monomer is included in an amount of 5~50 wt %, the di-functional monomer is included in an amount of 10~30 wt %, the tri-functional monomer is included in an amount of 20~40 wt %, the photo initiator is included in an amount of 1~20 wt %, and the adhesion promoter is included in an amount of 1~3 wt %.

The mono-functional monomer is included in an amount of 5~50 wt %, the di-functional monomer is included in an amount of 10~40 wt %, the tri-functional monomer is included in an amount of 10~20 wt %, the photo initiator is included in an amount of 1~20 wt %, and the adhesion promoter is included in an amount of 1~3 wt %.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1A:
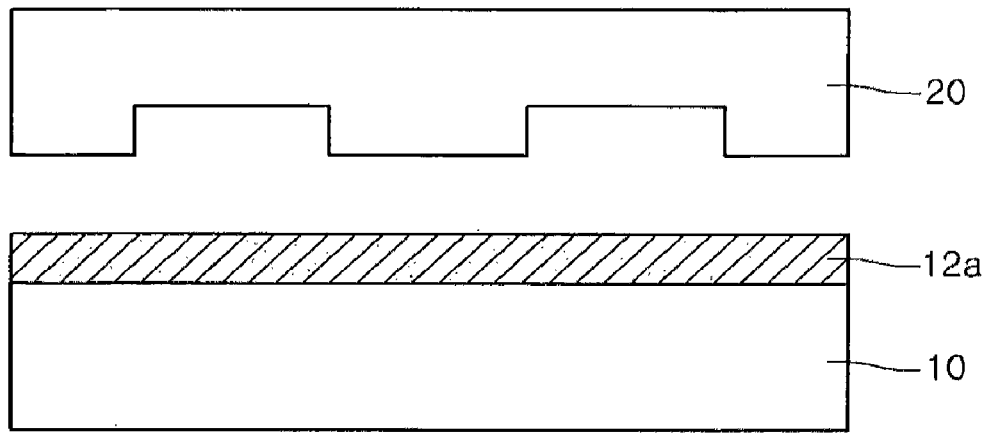
FIGS. 1A to 1E are cross-sectional views showing in steps a thin film formation method using an IPP resin layer according to the embodiment of the present disclosure.

Reference will now be made in detail to the embodiments of the present disclosure, examples of which are illustrated in the accompanying drawings. The embodiments introduced hereinafter are provided as examples in order to convey their spirits to the ordinary skilled person in the art. Therefore, the embodiments might be embodied in a different shape, so are not limited to the embodiments described here. Also, the size and thickness of the device might be expressed to be exaggerated for the sake of convenience in the drawings. Wherever possible, the same reference numbers will be used throughout this disclosure including the drawings to refer to the same or like parts.

An IPP resin layer according to an embodiment of the present disclosure includes a monomer containing an ether group and is used as a resin layer (or a thin film). As such, the IPP resin layer may improve the adhesive strength between a transparent electrode and an IPP resin layer. The IPP resin layer with this desired effect, according to the embodiment of the present disclosure, will now be explained in detail.

The resin layer for the IPP resin layer of the present embodiment includes a liquid pre-polymer, a photo initiator, and an adhesion promoter, among other components.

The liquid pre-polymer may include a monomer containing an ether group. More specifically, the liquid pre-polymer includes a mono-functional monomer, a di-functional monomer, and a tri-functional monomer.

In the case of compounding the liquid pre-polymer, the mono-functional monomer and the di-functional monomer can be used as the monomer containing the ether group. Alternatively, only the di-functional monomer can be employed as the monomer containing the ether group.

If the mono-functional monomer and the di-functional monomer are used as the monomer containing an ether group, the mono-functional monomer may include any one of DEGEEA (diethylene glycol ethylether arcylate) and EGMEA (ethylene glycol methylether acrylate), which each contain an ether group. Likewise, the di-functional monomer containing an ether group may include any one of PPGDA (poly(propylene glycol)diacrylate), PPGDMA (poly(propylene glycol)dimethacrylate), PGDA (propylene glycol diacrylate), and TEGDMA (tri(ethylene glycol)dimethacrylate).

On the other hand, when only the di-functional monomer is used as the monomer containing an ether group, the mono-functional monomer may include GMA (glycidyl methacrylate) and the di-functional monomer may include any one of PPGDA (poly (propylene glycol) diacrylate), PPGDMA (poly (propylene glycol) dimethacrylate), PGDA (propylene glycol diacrylate), TEGDMA (tri-(ethylene glycol) dimethacrylate).

The tri-functional monomer may include PETIA (pentaerythritol triacrylate).

GMA is a chemical compound indicated by the following Chemical Formula 1.

[Chemical Formula 1]

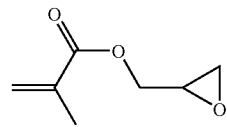

EGMEA is a chemical compound indicated by the following Chemical Formula 2.

[Chemical Formula 2]

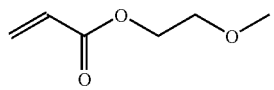

DEGEEA is a chemical compound indicated by the following Chemical Formula 3.

[Chemical Formula 3]

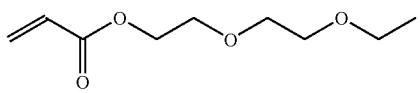

PPGDA is a chemical compound indicated by the following Chemical Formula 4.

[Chemical Formula 4]

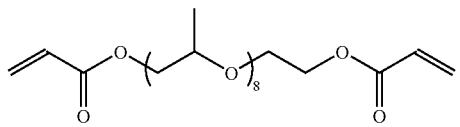

PPGDMA is a chemical compound indicated by the following Chemical Formula 5.

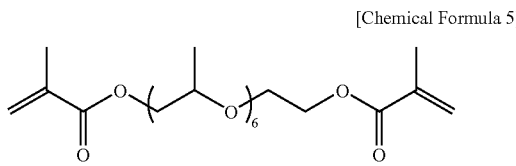

[Chemical Formula 5]

PGDA is a chemical compound indicated by the following Chemical Formula 6.

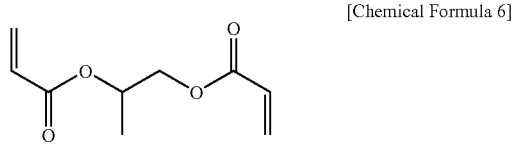

[Chemical Formula 6]

TEGDMA is a chemical compound indicated by the following Chemical Formula 7.

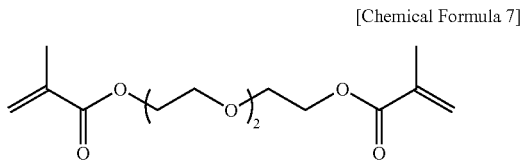

[Chemical Formula 7]

PETIA is a chemical compound indicated by the following Chemical Formula 8.

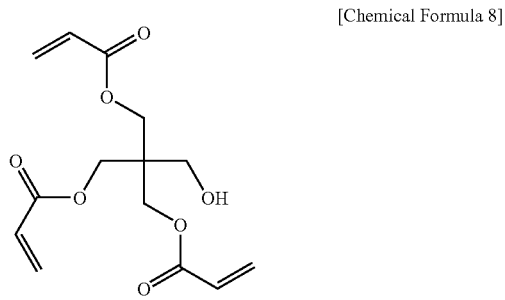

[Chemical Formula 8]

The photo initiator may include "2-carbonethoxy ethyltrimethoxysilane" or another component.

Also, the IPP resin layer of the present embodiment can be compounded to include the mono-functional monomer of 5~50 wt %, the di-functional monomer of 10~40 wt %, the tri-functional monomer of 10~40 wt %, the photo initiator of 1~20 wt %, and the adhesion promoter of 1~3 wt %. In this case, it is preferable for the PETIA with a viscosity of about 100 cP to be included in the resin layer because the PPGDA has a viscosity of about 30 cP.

Alternatively, if the di-functional monomer includes any one of PPGDA, PPGDMA, PGDA, and TEGDMA, the di-functional monomer included in the resin layer corresponds to an amount of about 10~40 wt %. In this case, the tri-functional monomer, which contains PETIA, included in the resin layer becomes an amount of about 10~20 wt %.

Alternatively, when the di-functional monomer includes any one of PPGDA, DEGEEA, EGMEA, PPGDMA, PGDA, and TEGDMA, the di-functional monomer included in the resin layer becomes an amount of about 10~30 wt %. At the same time, the tri-functional monomer of PETIA included in the resin layer corresponds to an amount of about 20~40 wt %.

As described above, the IPP resin layer of the present embodiment includes the monomer containing an ether group. Accordingly, the IPP resin layer can improve the adhesive strength between the transparent electrode and an IPP resin layer.

Hereinafter, methods of forming a desired thin film and manufacturing a flat panel display device (i.e., an LCD device) through the IPP process using the IPP resin layer will be explained.

FIGS. 1A to 1E are cross-sectional views explaining in steps a thin film formation method using the IPP resin layer according to an embodiment of the present disclosure.

A soft mold 20 including an embossed or intaglio pattern on it is disposed above a substrate 10 coated with an IPP resin layer 12a. The IPP resin layer 12a is formed of the resin layer including a liquid pre-polymer, a photo initiator, an adhesion promoter, and additive. The liquid pre-polymer includes a monomer containing an ether group.

Figure 1B:
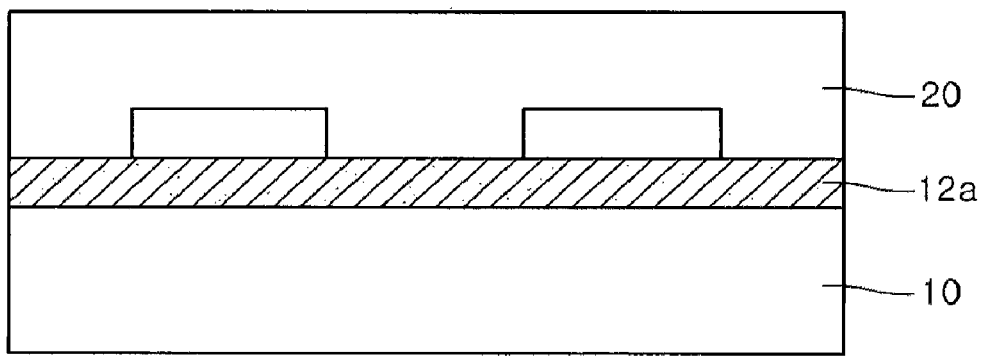

The soft mold 20 is in contact with the IPP resin layer 12a, as shown in FIG. 1B.

Figure 1C:
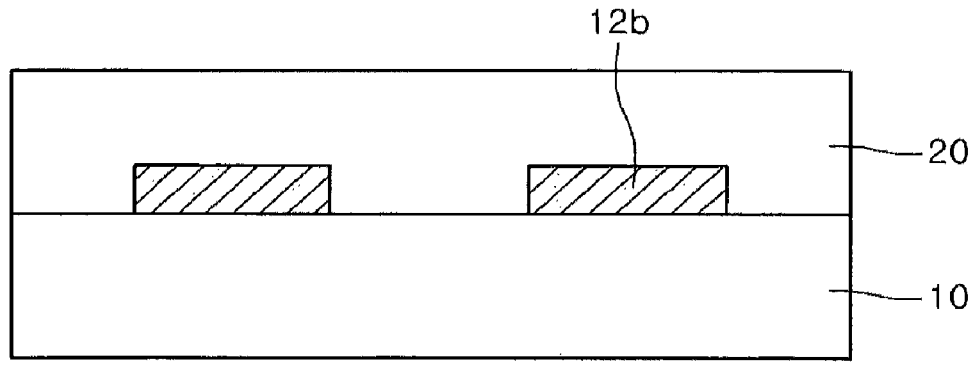

As such, part of the IPP resin layer 12a is sucked into the intaglio portion of the soft mold 20, as shown in FIG. 1C. The IPP resin layer 12a is hardened through a heat hardening process or a UV hardening process, thereby forming a thin film pattern 12b on the substrate 10.

Figure 1D:
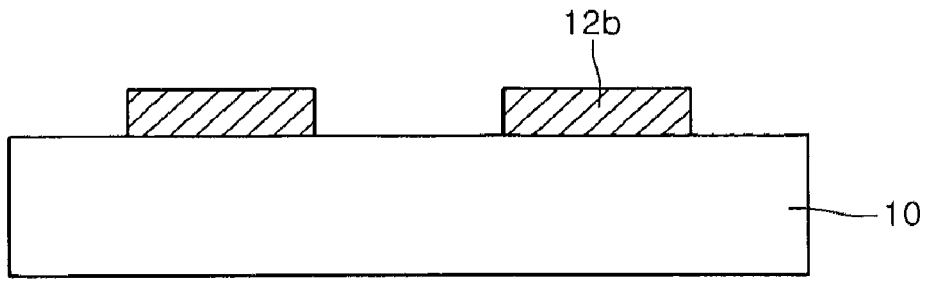

Then, the soft mold 20 is removed from the substrate 10 with the thin film pattern 12b, as shown in FIG. 1D.

Figure 1E:
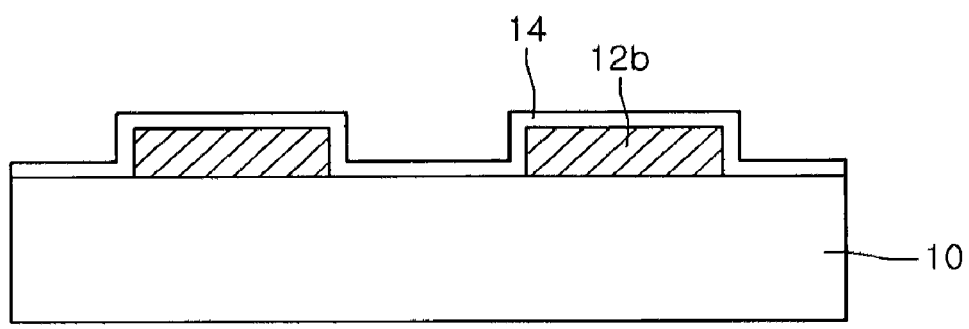

As shown in FIG. 1E, a transparent electrode material such as indium-tin-oxide or indium-zinc-oxide, is formed on the substrate 10 including the thin film pattern 12b and is patterned, so that a transparent electrode 14 is formed.

Figure 2:
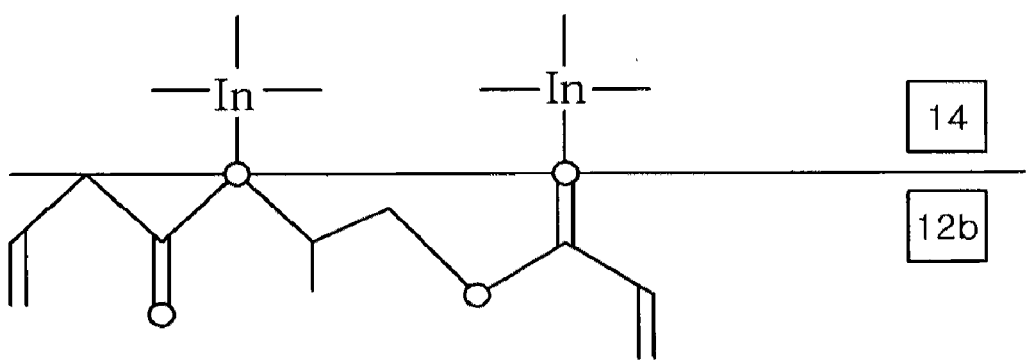
FIG. 2 is a schematic diagram showing the combination of a transparent electrode material and an ether group according to an embodiment of the present disclosure.

When the transparent electrode material is deposited on the substrate 10 with the thin film pattern 12b of the IPP resin layer through a sputtering process, indium included in the transparent electrode material reacts with the ether group (—O—) contained in the IPP resin layer, as shown in FIG. 2. Accordingly, the IPP resin layer pattern 12b has an adhesive strength more intense than that of the related IPP resin layer.

In this manner, as the IPP resin layer including the monomer containing an ether group is used for the IPP resin layer, the adhesive strength between the transparent electrode and the IPP resin layer pattern (i.e., the thin film pattern 12b) can be improved.

FIGS. 3A to 3D are cross-sectional views showing in steps a method of manufacturing a transflective thin film transistor array substrate using an IPP resin layer according to an embodiment of the present disclosure.

Figure 3A:
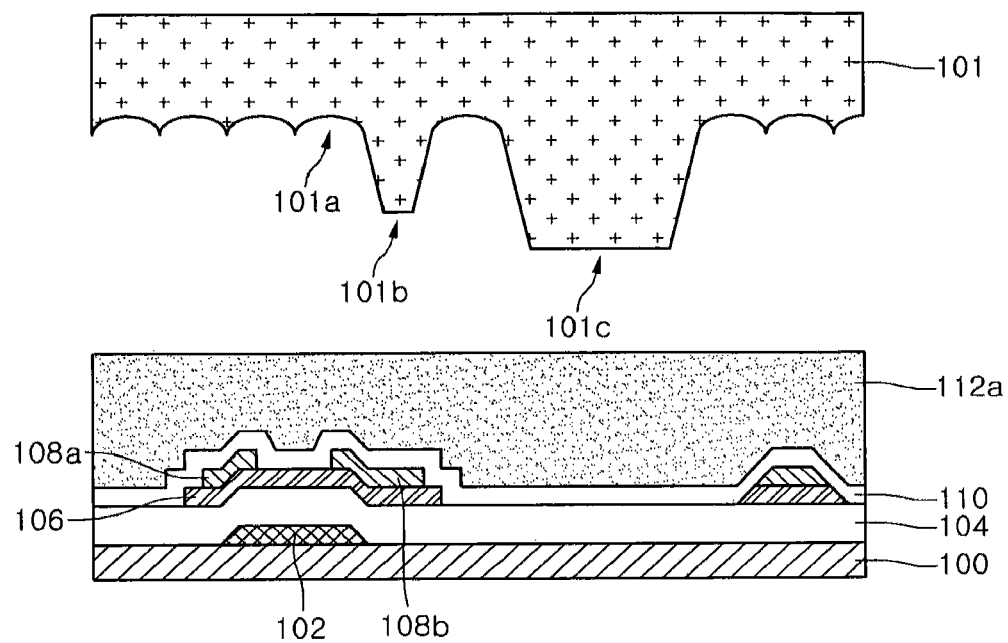
FIGS. 3A to 3D are cross-sectional views showing in steps a method of manufacturing a transflective thin film transistor array substrate using an IPP resin layer according to the embodiment of the present disclosure.

Referring to FIG. 3A, a gate electrode 102 is formed on a substrate 100 and a gate insulation film 104 is formed on the entire surface of the substrate 100 with the gate electrode 102. An active/ohmic contact layer 106 and source/drain electrodes 108a/108b are formed on the gate insulation film. The active/ohmic contact layer 106 and the source/drain electrodes 108a/108b can be formed through a single masking process or a double masking process.

A first protective film 110 used as an insulation film and an IPP resin layer 112a and a second protective (or passivation) film are sequentially formed on the substrate with the above structure. The first protective film 110 is an inorganic insulation film such as a silicon nitride film or a silicon oxide film.

The IPP resin layer 112a used for the second protective film is formed of the IPP resin layer including a liquid pre-polymer, a photo initiator, an adhesion promoter, and so on, as described above. The liquid pre-polymer includes a monomer containing an ether group.

Also, a soft mold 101 including an embossed or intaglio pattern on it is disposed above a substrate 100 coated with an IPP resin layer film 112a. The soft mold 101 has a surface layer which includes concaves 101a for forming an embossed pattern, a first convex portion 101b for forming a contact hole which exposes the drain electrode, and a second convex portion 101c for forming a penetration portion.

Figure 3B:
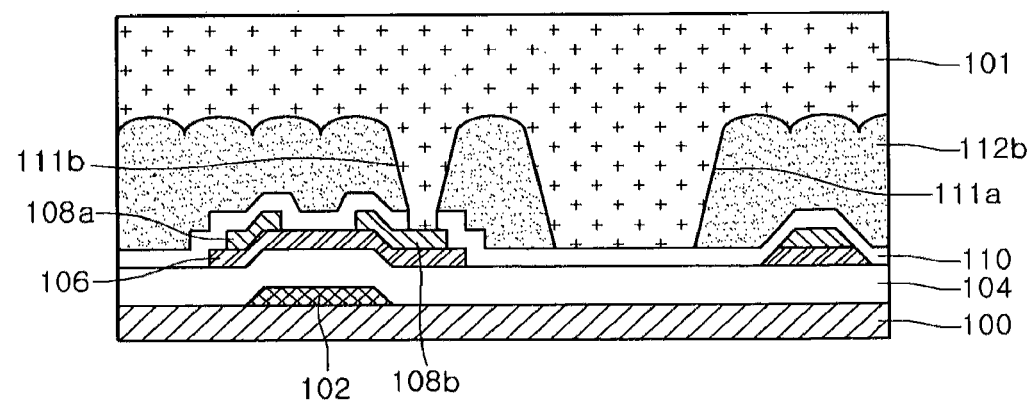

The soft mold 101 is in contact with the IPP resin layer 112a, as shown in FIG. 3B. As such, part of the IPP resin layer 112a is filled up the concaves 101a and first convex portions 101b and second convex portions 101c of the soft mold 101. The IPP resin layer 112a is formed the second protective film 112b on the substrate 100 by hardening through a heat hardening process or a UV hardening process. This second protective film 112b includes a contact hole 111b, a penetration hole 111a for the formation of a penetration portion, and an embossed pattern.

Figure 3C:
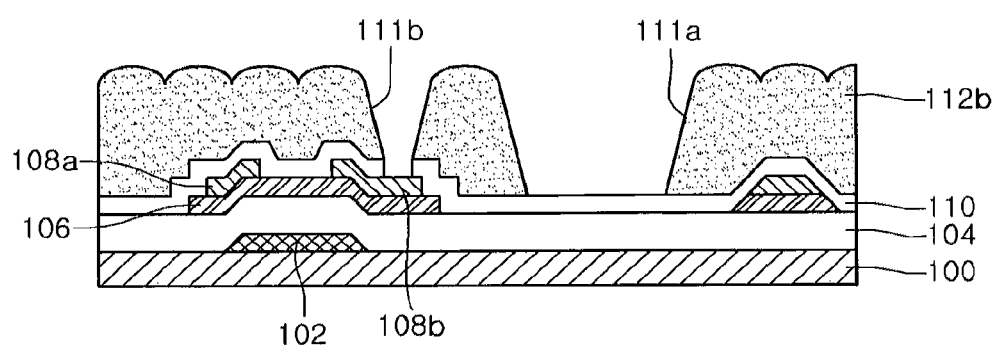

As shown in FIG. 3C, the soft mold 101 is removed from the substrate 100 on which that the second protective film 112b including a contact hole 111b, a penetration hole 111a for the formation of a penetration portion, and an embossed pattern is formed.

Figure 3D:
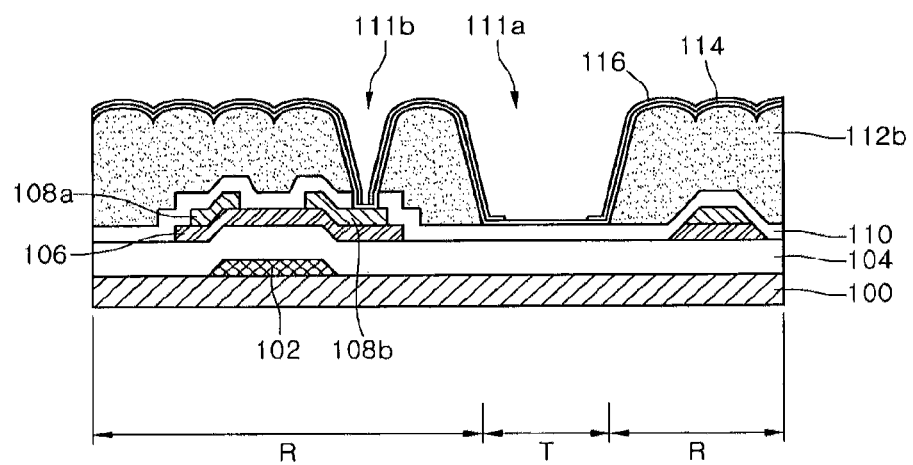

Next, as shown in FIG. 3D, a transparent electrode material such as indium-tin-oxide or indium-zinc-oxide is formed on the entire surface of the substrate 100, which includes the thin film pattern 112b, and is patterned, so that a pixel electrode 114 is formed on a reflection region R and a penetration region T. The pixel electrode 114 is formed in a rugged structure along the embossed pattern of the second protective film. Also, the pixel electrode 114 is connected to the drain electrode 108b through the contact hole 111b.

The transparent electrode material of the pixel electrode is deposited on the second protective film 112b, which includes the contact hole 111b, the penetration hole 111a of the pixel region, and the embossed pattern. When this transparent electrode material is deposited through a sputtering process, indium components included into the transparent electrode material react with the ether group (—O—) contained in the IPP resin layer. Accordingly, the second protective film 112b of the IPP resin layer has an adhesive strength more intense than that of the related IPP resin layer.

Finally, a metal material for a reflection electrode 116 is formed and patterned on the transparent electrode 114, so that the reflection electrode 116 is provided on the reflection region R. In the end, a transflective thin film transistor array substrate may be provided.

In this way, as the IPP resin layer including the monomer containing an ether group is used for the IPP resin layer, the adhesive strength between the transparent electrode and the IPP resin layer (i.e., the second protective layer 112b) can be improved.

FIGS. 4A to 4D are cross-sectional views showing in steps a method of manufacturing a thin film transistor array substrate using an IPP resin layer according to an embodiment of the present disclosure.

Figure 4A:
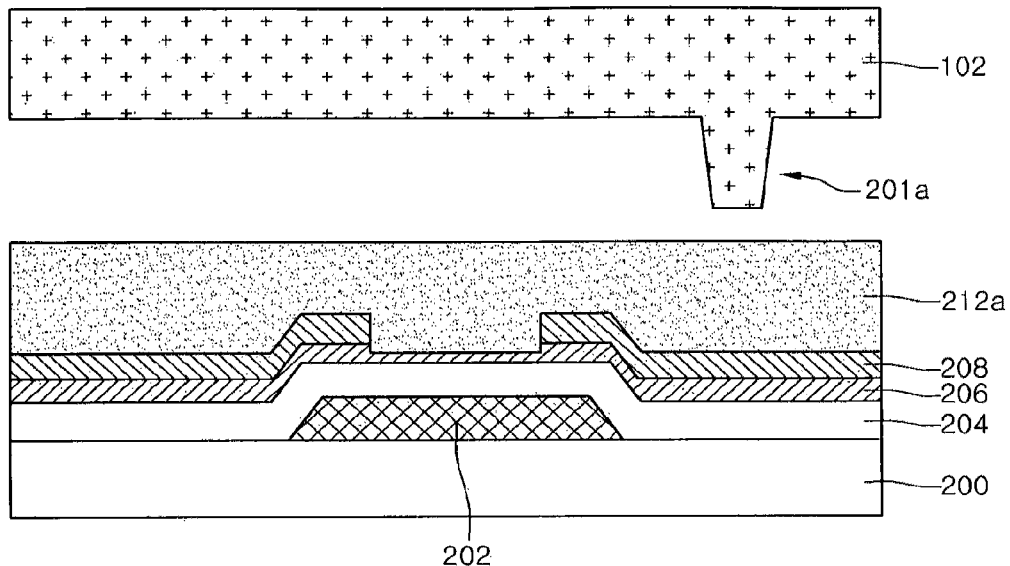
FIGS. 4A to 4D are cross-sectional views showing in steps a method of manufacturing a thin film transistor array substrate using an IPP resin layer according to the embodiment of the present disclosure.

Referring to FIG. 4A, a gate electrode 202 is formed on a substrate 200 and a gate insulation film 204 is formed on the entire surface of the substrate 200 with the gate electrode 202. An active/ohmic contact layer 206 and source/drain electrodes 208 are formed on the gate insulation film 204 above the gate electrode 202. The active/ohmic contact layer 206 and the source/drain electrodes 208 can be formed through a single masking process or a double masking process.

An IPP resin layer 212a for a protective (or passivation) film is formed on the substrate 200 with the above structure. In this case, an additionally protective film (not shown) including an inorganic insulation film such as a silicon nitride film or a silicon oxide film can be formed before the formation of the IPP resin layer 212a. The IPP resin layer 212a used for the protective film is formed of the IPP resin layer including a liquid pre-polymer, a photo initiator, an adhesion promoter, and additive, as described above. The liquid pre-polymer includes a monomer containing an ether group.

Also, a soft mold 102 including a fixed intaglio pattern on it is disposed above a substrate 200 coated with an IPP resin layer 212a. The soft mold 101 includes on its surface a convex portion 201a for a contact hole exposing the drain electrode.

Figure 4B:
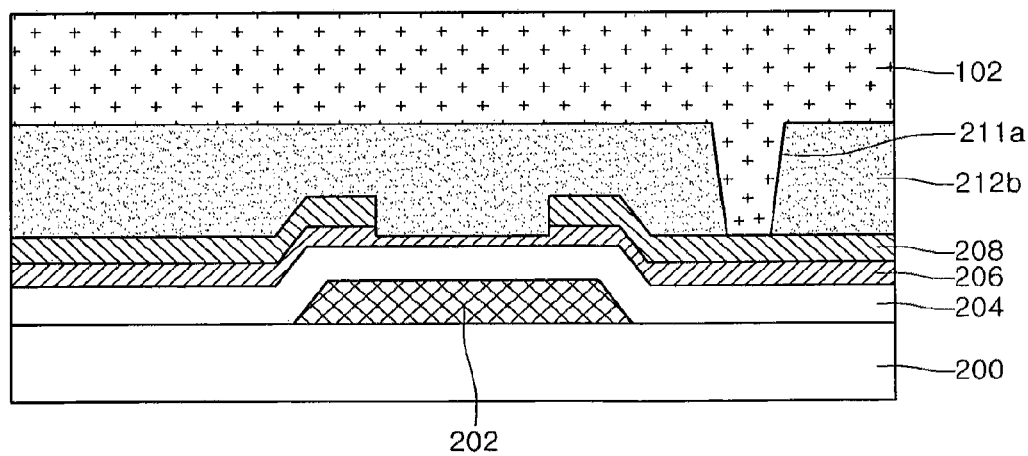

The soft mold 102 is in contact with the IPP resin layer 212a, as shown in FIG. 4B. As such, the convex portion 201a of the soft mold 102 forms a contact hole in the IPP resin layer 212a. The IPP resin layer 212a is hardened through a heat hardening process or a UV hardening process, so that the second protective film 212b including a contact hole 211a is formed on the substrate 200.

Figure 4C:
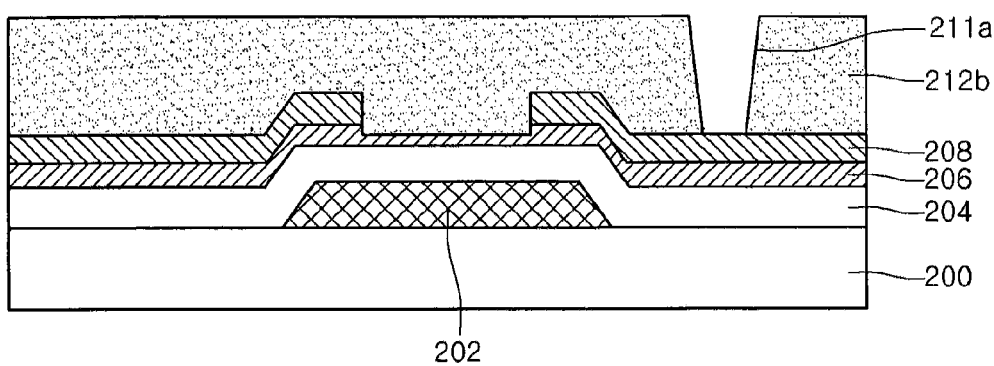

As shown in FIG. 4C, the soft mold 102 is removed from the substrate 200 on which the protective film 212b including a contact hole 211a is formed.

Figure 4D:
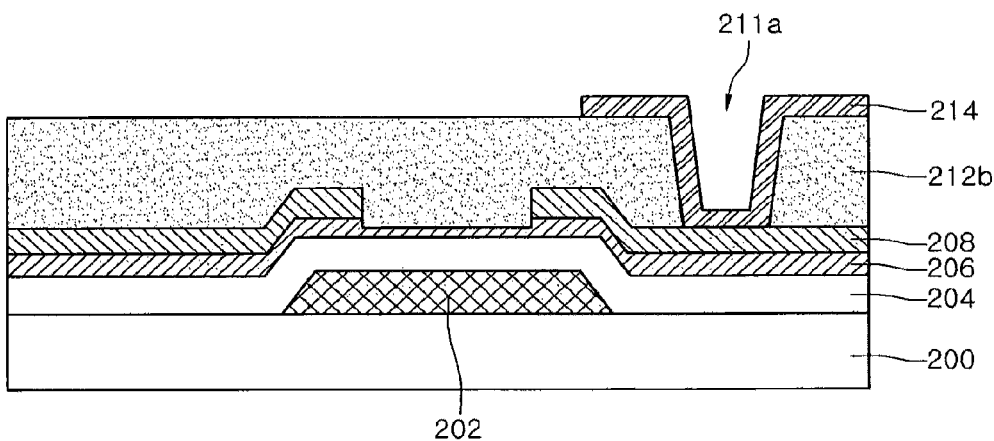

Next, a transparent electrode material such as indium-tin-oxide or indium-zinc-oxide is formed on the entire surface of the substrate 200, which includes the protective film 212b, and is patterned, thereby forming a pixel electrode 214 as shown in FIG. 4D. In the end, a thin film transistor array substrate may be provided. The pixel electrode 214 is connected to the drain electrode 208 through the contact hole 211a.

When the transparent electrode material for the pixel electrode 214 is deposited on the protective film 212b which includes the contact hole 211a through a sputtering process, indium components included in the transparent electrode material react with the ether group (—O—) contained in the IPP resin layer. Accordingly, the protective film 212b of the IPP resin layer has an adhesive strength more intense than that of the related IPP resin layer.

In this way, as the IPP resin layer which includes the monomer containing the ether group is used for the IPP resin layer, the adhesive strength between the transparent electrode and the IPP resin layer (i.e., the protective film 212b) can be improved.

Figure 5A:
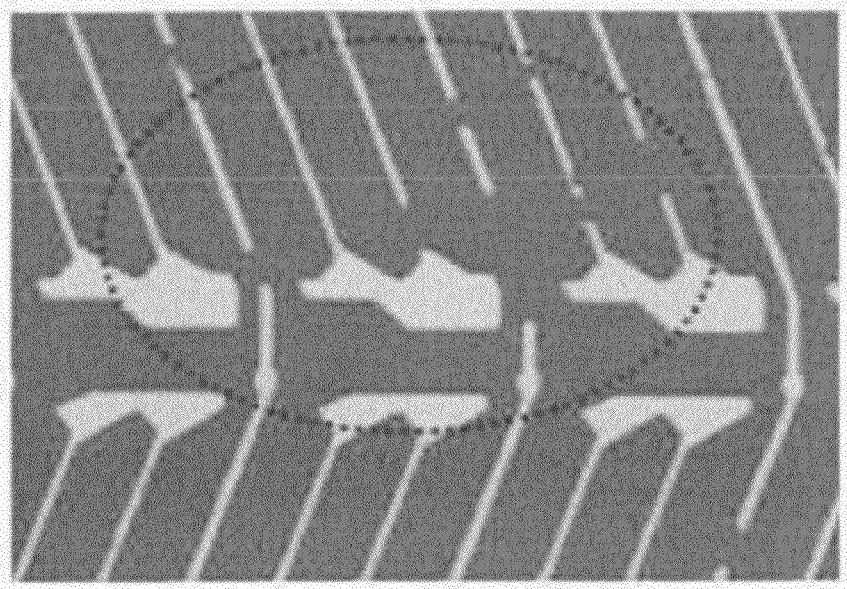
FIGS. 5A and 5B are views explaining the degree of adhesive strength between a transparent electrode and an IPP resin layer.
Figure 5B:
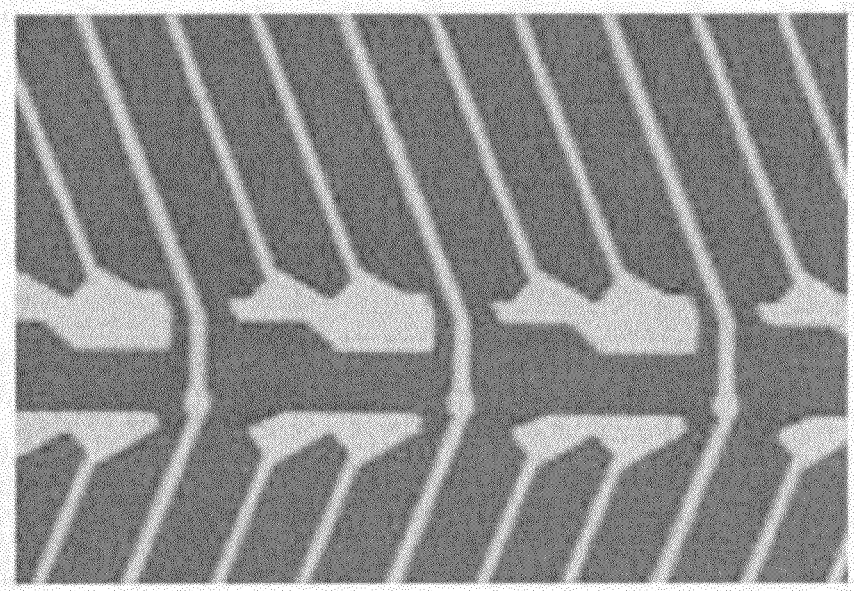

FIGS. 5A and 5B are views proving the degree of adhesive strength between a transparent electrode and an IPP resin layer. In order to check the degree of adhesive strength between the transparent electrode and the IPP resin layer, the peeling degree of the transparent electrode is experimentally observed after wet-etching the transparent electrode formed on the IPP resin layer during a fixed period. FIG. 5A shows the peeling degree of the transparent electrode on the IPP resin layer according to the related art. FIG. 5B depicts the peeling degree of the transparent electrode on the IPP resin layer according to the present embodiment. As seen in FIG. 5A, broken portions (or disconnected portions) of the transparent electrode exist within a dotted line circuit. Accordingly, the transparent electrode on the related art IPP resin layer is easily peeled. On the contrary, the transparent electrode on the IPP resin layer according to the present embodiment has no the broken portions (or disconnected portions), as shown in FIG. 5B. Consequently, it is evident that the transparent electrode on the IPP resin layer according the present embodiment is resistant to peeling (or difficult to peel).

Furthermore, the peeling degree of the transparent electrode in accordance with the wet-etching period is measured as the following table 1.

TABLE 1

| Wet-etching period | IPP resin layer (related art) | IPP resin layer (present embodiment) |
|---|---|---|
| 3 Minutes | 1.14 μm | 0.99 μm |
| 5 Minutes | 1.7 μm | 1.31 μm |

As described in table 1, the peeled length of the transparent electrode on the IPP resin layer according to the present embodiment is shorter than that on the IPP resin layer of the related art. In other words, it is evident that the transparent electrode on the IPP resin layer according the present embodiment is difficult to peel.

As described above, the IPP resin layer according to an embodiment of the present disclosure which includes the monomer containing an ether group is used for the IPP resin layer. Therefore, the adhesive strength between the transparent electrode and the IPP resin layer including the IPP resin layer can be improved.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

What is claimed is:

1. A method of manufacturing a liquid crystal display device, the method comprising:

disposing a soft mold above a substrate which includes an in-plane printing resin film on the substrate;

bringing the soft mold into contact with the in-plane printing resin film to form a thin film pattern;

removing the soft mold from the substrate; and forming a transparent electrode on the substrate which includes the thin film pattern, wherein the in-plane printing resin film includes a liquid pre-polymer including a mono-functional monomer, a di-functional monomer including an ether group, and a tri-functional monomer including pentaerythritol triacrylate;

a photo initiator; and a adhesion promoter, and wherein the ether group includes any one of poly(propylene glycol)diacrylate, poly (propylene glycol) dimethacrylate, propylene glycol diacrylate, and tri (ethylene glycol) dimethacrylate.

2. The method according to claim 1, wherein the mono-functional monomer includes any one of diethylene glycol ethylether acrylate, ethylene glycol methylether acrylate.

3. The method according to claim 1, wherein the mono-functional monomer includes glycidyl methacrylate.

4. The method according to claim 1, wherein the mono-functional monomer is included in an amount of 5~50 wt %, the di-functional monomer is included in an amount of 10~30 wt %, the tri-functional monomer included in an amount of 20~40 wt %, the photo initiator is included in an amount of 1~20 wt %, and the adhesion promoter is included in an amount of 1~3 wt %.

5. The method according to claim 1, wherein the mono-functional monomer is included in an amount of 5~50 wt %, the di-functional monomer is included in an amount of 10~40 wt %, the tri-functional monomer is included in an amount of 10~20 wt %, the photo initiator is included in an amount of 1~20 wt %, and the adhesion promoter is included in an amount of 1~3 wt %.

* * * * *